(12) United States Patent
Stolk et al.

(10) Patent No.: US 6,194,127 B1
(45) Date of Patent: *Feb. 27, 2001

(54) RESISTIVE SHEET PATTERNING PROCESS AND PRODUCT THEREOF

(75) Inventors: Richard D. Stolk, Chesterfield; William J. Keyes, St. Charles, both of MO (US)

(73) Assignee: McDonnell Douglas Corporation, Saint Louis, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/085,048

(22) Filed: May 27, 1998

(51) Int. Cl.[7] .................................................... G03F 7/00
(52) U.S. Cl. ......................... 430/313; 430/318; 430/330; 216/102
(58) Field of Search ................................. 430/312, 313, 430/318, 322, 323, 330; 216/87, 100, 102, 105

(56) References Cited

U.S. PATENT DOCUMENTS

| | | | |
|---|---|---|---|
| 3,380,863 | 4/1968 | Silberberg et al. | 156/12 |
| 3,647,508 | 3/1972 | Gorrell | 117/38 |
| 3,935,083 | 1/1976 | Tomozawa et al. | 204/38 A |
| 4,098,712 | * 7/1978 | Ikeda et al. | 252/79.5 |
| 4,398,994 | 8/1983 | Beckett | 156/659.1 |
| 4,521,476 | * 6/1985 | Asia et al. | 428/209 |
| 4,555,414 | 11/1985 | Hoover et al. | 427/43.1 |
| 4,747,907 | * 5/1988 | Acocella et al. | 156/642 |
| 4,869,778 | 9/1989 | Cote | 156/635 |
| 4,992,144 | * 2/1991 | Walsh et al. | 204/20 |
| 5,043,201 | 8/1991 | Cote | 428/195 |
| 5,206,116 | 4/1993 | Daniels et al. | 430/311 |
| 5,262,280 | 11/1993 | Knudsen et al. | 430/312 |
| 5,352,325 | * 10/1994 | Kato | 156/644 |
| 5,352,634 | 10/1994 | Brody | 437/228 |
| 5,366,846 | 11/1994 | Knudsen et al. | 430/280 |
| 5,395,718 | 3/1995 | Jensen et al. | 430/5 |
| 5,426,074 | 6/1995 | Brody | 437/228 |
| 5,468,409 | 11/1995 | Dull | 252/79.2 |
| 5,468,597 | 11/1995 | Calabrese et al. | 430/315 |
| 5,510,216 | 4/1996 | Calabrese et al. | 430/16 |
| 5,552,249 | 9/1996 | Jensen et al. | 430/5 |
| 5,567,554 | 10/1996 | Jensen et al. | 430/5 |
| 5,603,158 | * 2/1997 | Murata et al. | 29/486 |
| 5,633,105 | 5/1997 | Jensen et al. | 430/18 |
| 5,650,249 | 7/1997 | Dull et al. | 430/5 |
| 5,712,613 | 1/1998 | Buckner et al. | 338/217 |
| 5,928,839 | * 7/1999 | Rath et al. | 430/313 |

OTHER PUBLICATIONS

Product Brochure, "Shipley Multiposit[198] 9500 Photodielectric", by Shipley Company, Marlborough, MA 01752, four pages total, copyright 1997.

* cited by examiner

Primary Examiner—Kathleen Duda
(74) Attorney, Agent, or Firm—Westerlund & Powell, P.C.

(57) ABSTRACT

Pattern transfer process for manufacturing a patterned resistive sheet with reduced process steps, and the resulting article of manufacture.

16 Claims, 2 Drawing Sheets

RESISTIVE SHEET PATTERNING PROCESS AND PRODUCT THEREOF

BACKGROUND OF THE INVENTION

The present invention relates to manufacture of patterned resistive sheets and the resulting article of manufacture.

Resistive sheets have been used for attenuating, shielding and modulating electromagnetic fields, microwaves fields, and so forth, generated in the vicinity of other electrically powered components. A conventional resistive sheets or films basically involves a thin pattern of metal attached to thin, flexible polymeric substrate film where the metal pattern is designed to yield a desired ohms per square characteristic across the surface of the resistive sheet when measured with a four point probe. The polymeric substrate typically is a thin material capable of flexure out of its major plane to permit deformation of the resistive sheet accommodate any a three-dimensional installation that might be envisaged. The formation of the preselected pattern of metal on the polymeric substrate can be executed via an additive process or a subtractive process.

For instance, manufacturers of two-sided resistive metallized sheets have used a number of approaches to create a desired pattern in the surface of a metallized polymeric sheet or film.

In one previous subtractive approach summarized in the flow diagram shown in FIG. 1, a first step A involves coating each metallized surface of the polymeric substrate with a photosensitive polymer composition, i.e., a resist. Alternately, the metallized surface of the polymeric substrate has been laminated with two preformed solid sheets of photosensitive resist using a two roll mill by feeding the three requisite sheets in the requisite lay-up into the nip of the compression rolls. However, a drawback associated with laminating the resist to the substrate is that the preformed, solid resist sheets tend to wrinkle and incur other surface distortions during lamination to the metallized surface, which impact the resolution of the subsequent etch performed on the exposed metal surface. Accordingly, the following discussion describes the process flow in the context of using a resist coating for any thickness of metallized polymeric substrate.

In step B indicated in FIG. 1, the resist-coated substrate is soft baked to remove solvent from the resist coating. Then, in step C indicated in FIG. 1, an imager with two reticles or master masks defining the desired exposure patterns are aligned in a coordinated manner over the opposing major surfaces to ensure patterns in registration or intentional offset are provided. The reticles are imaged directly on to the resists with U.V. light to create the specified exposure patterns as between the top and bottom metallized surfaces. The imager uses a source of light at a specific wavelength that will crosslink those regions of the resist polymer that are exposed to light projected through the reticle to delineate certain exposed and non-exposed patterns in the resist. The crosslinked (exposed) resist portions later serve as a temporary mask for a subsequent step of chemically etching the exposed metallized surfaces during photofabrication. However, initially after radiation exposure, the resist is subjected to post-exposure baking (i.e., a hard bake) to advance crosslinking in the exposed areas and densify these areas, as indicated in step D of FIG. 1.

Next, as indicated by step E of FIG. 1, the non-irradiated (non-exposed) resist regions are developed, e.g., in an aqueous sodium carbonate solution, which dissolves the non-exposed resist portions, thereby forming openings in the resist coating through which surface regions of the underlying metal surface are exposed that correspond to the non-exposed resist regions.

Subsequent to development and in a separate operation indicated as Step F in FIG. 1, the metal regions exposed in the openings formed in the resist in the prior development step E are removed with a different wet chemical etchant than the developer solution. For step F, the etch selectivity for this metal etch is manipulated such that the etchant used removes the exposed metal much more rapidly than the crosslinked (exposed) resist regions so as to define a discontinuous metallized surface in a desired pattern having a desired measurable resistance associated with it.

Finally, in step G indicated in FIG. 1, the temporary crosslinked resist covering the non-etched metal regions is stripped with another chemical, such as a caustic or amine solution. The metal film disposed under the resist has to be corrosion resistant to the stripper solution. In the case of aluminized film, the conventional caustic stripper tends to be overly aggressive resulting in undercutting of portions of the metal pattern. Additionally, since conventional negative working polymeric photoresists tend to be based on polymer chemistry which degrades if exposed to in-service temperatures of about 140–150° F. (60–66° C.), so these types of resists must be removed (stripped) from the resistive sheet if workpiece operation temperatures of above 100–110° F. (38–43° C.) are anticipated.

Where a sheet of MYLAR® or KAPTON®. Which has been aluminized on both sides, is used as the material to make the resistive sheet, the aluminum tends to be corroded during the last step, Step G, involving stripping the resist off the metal pattern. This situation has complicated the use of aluminum as a low cost material for resistive sheets since the aluminum tends to be less tolerant of aggressive resist strippers. The aluminum patterns may withstand an amine solution used for resist stripping. However, the conventional amine chemicals used for resist stripping. e.g., ethylene diamine, generally are relatively expensive and require special precautions during storage, use, and disposal that most operators want to avoid.

More generally, as another mode of pattern transfer processing for defining a metal pattern on a polymeric substrate, U.S. Pat. No. 4,869,778 describes a process for the microdemetallization of an aluminized MYLAR® film involving printing a micropattern of a caustic resistant U.V. curable resin on the aluminum surface, then etching of the exposed aluminum regions with warm saturated caustic solution, followed by immediate rinsing of the patterned surface with an acidic solution to neutralize the etchant. The caustic resistant resin resides on the metal pattern formed upon completion of the process. The micropatterns defined by the process of the '778 patent are stated to involve aluminum line widths of from about 0.2 to 2 mils. The use of printed resists has the drawback that very high resolution, fine minimum dimensions in metal patterns may not be possible.

SUMMARY OF THE INVENTION

The present invention relates to a pattern transfer process for manufacturing a patterned resistive sheet with reduced process steps, and the resulting article of manufacture.

For purposes of this invention, the terminology "pattern transfer process" means taking a suitably patterned mask, and imaging it on a surface of a metallized substrate which is precoated with a resist. This is followed by an engraving process where the resist is developed and the resulting exposed resist pattern is used for removing metal from the metallized substrate in order to delineate a desired resistive or conductive pattern.

In one embodiment, a unique feature of the present invention is that the development of the image-wise exposed resist and the pattern transfer into the underlying metal is accomplished in a single uninterrupted, continuous step in which the same chemical formulation is employed to not only effect development of the resist but also for removal of metal exposed in the windows created in the resist.

As a result, the patterned image for the resistive sheet is created in fewer steps than otherwise possible with customary photofabrication approaches. Again, the development of the image-wise exposed resist and etching of the metal film is performed in a single etching step. To accomplish this remarkable result, a permanent, high temperature resist material is used that, in crosslinked form upon U.V. exposure, has high etch resistance to caustic etchants that act on metals, while the uncrosslinked form of the resist is readily etchable in caustic etchants for metal.

The present invention achieves high pattern resolution even though only a single processing step is performed for both resist development and pattern transfer processing into the metal.

In a preferred embodiment of the present invention, a epoxy-based coating is used as a negative working resist that can be left intact on the surface of the defined metal pattern after the resist has been image-wise U.V. exposed (i.e., crosslinked). As a consequence, the necessity of using resist stripping chemicals that could attack the patterned metal is eliminated. Moreover, the retention of the crosslinked (U.V. exposed) portions of the resist over the defined metal pattern protects the patterned metal surfaces from air oxidation over time that otherwise could occur and which could undesirably alter the resistance of the patterned sheet. In this way, the resist-protected metal patterns formed by the present invention are endowed with greater stability by virtue of the multi-tasked resist. No separate, extraneous (antioxidant) protective coatings need be formed on the final metal pattern for this purpose during post-processing.

Another advantage associated with this invention is that it accommodates the usage of two-sided metallized sheets as a resistive material.

BRIEF DESCRIPTION OF THE DRAWINGS

These and various other features and aspects of the present invention will be readily understood with reference to the following detailed description read in conjunction with the accompanying drawings, in which.

DETAILED DESCRIPTION OF THE INVENTION

Figure 1:
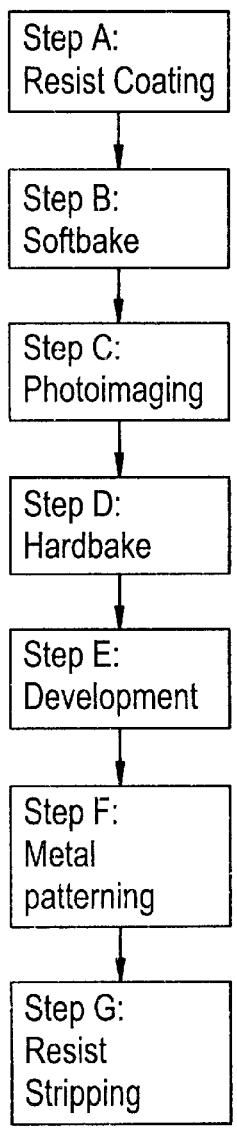
FIG. 1 is a flow chart summarizing the chronology of process steps used in a conventional pattern transfer process performed on a metallized polymeric substrate.
Figure 2:
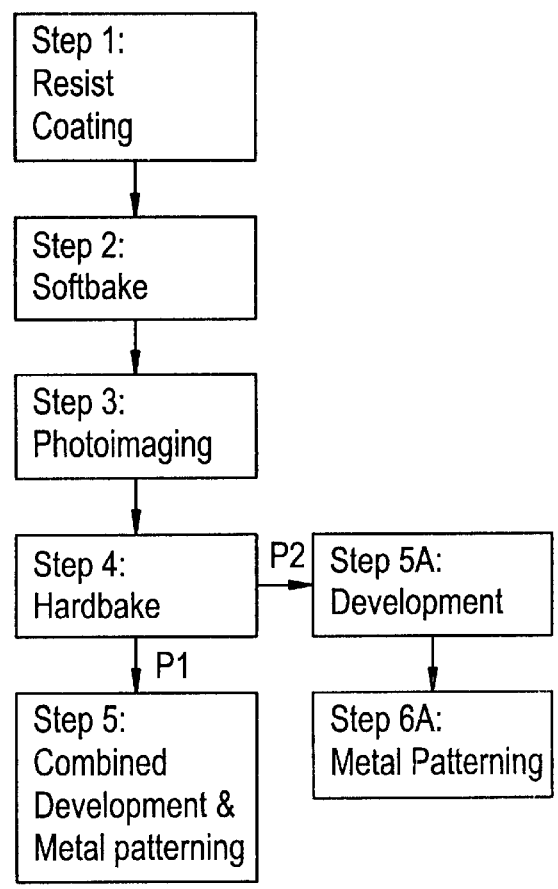
FIG. 2 is a flow chart summarizing the chronology of process steps used in the inventive pattern transfer process performed on a metallized polymeric substrate.

Referring now to the drawings, and particularly to FIG. 2, step 1 of the present invention involves coating a metallized substrate, as the workpiece, with a negative working resist. The present invention concerns forming an electrical-field altering image on the metallized substrate. The resists used in the present invention are negative working resists in that the image formed in the resist corresponds to the exposure pattern.

The metallized surface used as the workpiece involves insulating substrate materials, flexible or rigid in nature, having either one or both its major surfaces metallized with a thin continuous metal film of uniform thickness. The metal material can be aluminum, aluminum alloys (e.g., Al—Cu, Al—Cu—Si, Al—Sn), copper, nickel, electroless nickel, nickel alloys (e.g., Ni—B, Ni—Fe, Ni—Fe—Co, Ni—P), and the like. However, as will be explained in greaser detail hereinbelow, the process of this invention will vary between two possible process paths indicated in FIG. 2 as paths P1 and P2 depending on whether the metal is an aluminum-based caustic etchable metal or a metal other than aluminum which is acid pH etchable.

Typically, the substrate will be metallized on both major surfaces. The substrate film material preferably includes a polymeric substrate film that is an electrical insulating polymeric material, e.g., polyethylene terephthalate (e.g. MYLAR®) or a polyimide (e.g., KAPTON®). The polymeric film thickness can range from less than one mil to over five mils. The metallization film can be formed on the polymeric substrate in a wide variety of conventional manners, and is not particularly limited. For instance, a thin metallized film can be formed on the polymeric substrate by sputtering, vacuum evaporation, e-beam deposition, electroless plating, and so forth. The thickness of the metal film formed on the polymeric substrate is controlled to provide a thickness of a desired resistivity in ohms per square.

The attraction of using aluminized MYLAR®, in particular, is that it is commercially manufactured in high volume by suppliers, such as Schaar Industries, Inc., Bloomfield, Conn., and it has excellent uniformity in thickness and electrical properties. As an additional advantage of MYLAR®, the material is highly flexible and capable of deformation out of the major plane of the carrier to conform to the exterior contour presented by flat or even complicated three-dimensional objects.

In any event, the metallized substrates can be coated with resist by any convenient coating technique, such as dip coating, curtain coating, spin coating, roller coating, slot coating, flood coating, electrostatic spray coating, spray coating and so forth, as long as the coating method permits a uniform thickness of resist to be applied to either one or both major surfaces of the metallized substrate. If needed, the metallized substrate can be cleaned and dried before resist coating.

As the negative working resist, U.V. curable resins which have been found to be particularly suitable for the practice of the present invention are U.V. curable epoxy-containing resins that are negative working photoresist materials. A suitable example is MULTIPOSIT™ 9500 Photodielectric resist, which is available from Shipley Company, Inc., Marlborough, Mass. 01752–3001, U.S.A. This resist is understood to be a photoimageable composition containing a radiation sensitive component (usually selected from a photoacid generator or a photobase generator), a resin binder, a polybutadiene that has one or more internal epoxide groups, and preferably further includes a crosslinking agent such as melamine or an epoxidized material, such as described in U.S. Pat. No. 5,262,280, which teachings are incorporated herein by reference. The above-mentioned epoxy-based negative working resists also are dielectric materials in their cured state. Thus, those resist materials can be characterized as photodielectric materials.

The solid components of the resist are dissolved in suitable solvent to provide a liquid coating composition. The solvent can be, for example, propylene glycol monomethyl ether acetate, or other solvents such as described in U.S. Pat. No. 5,262,280. The solids content in the solvent generally can vary from about 10 to 70 weight percent, more preferably between about 15 to 25 weight percent, of the total resist coating composition for purposes of this invention. The viscosity of the MULTIPOSIT™ 9500 Photodielectric resist coating composition, for instance, is pre-adjusted before use to a suitable coating viscosity of between about 150 to 250 cps (25° C.).

As indicated by step 2 in FIG. 2, the resist-coated metallized substrates are air dried and soft baked for a sufficient time and at a sufficient temperature to drive out (volatize) solvents in the resist. The soft bake generally can be performed at about 90–100° C. in a hot air convection oven (about 20–30 minutes) or on a vacuum hot plate (about 1 to 3 minutes). Care must be taken to avoid excessive temperature during the soft bake which could induce premature crosslinking of the resist composition.

Next, as indicated by step 3 of FIG. 2, the resist-coated workpiece is then photoimaged. The process of photo-reproducing a desired image to the photoimageable layer is well known in the art and involves selectively exposing the resist layer to a source of activating radiation to initiate crosslinking in the exposed area. The selective exposure can be effected by conventional means, such as by projecting radiation through a reticle mask, e.g., a thin film of chromium can be used to define the desired masking pattern on a soda-lime or borosilicate glass plate, on to the resist. Suitable sources of activating radiation include an ultraviolet light source, electron beam, or x-rays. Preferably, the activating radiation used is U.V. light. The resist-coated workpiece was exposed to U.V. light using a mercury arc lamp source imaged through a reticle defining the desired metal pattern such that the exposed resist areas received a dosage of about 800 mJ/cm$^2$ and crosslinked.

Irradiation of the resist molecules by an energetic beam, e.g., collimated U.V. light, results in bonding and cross-linking of adjacent polymer chains, and thus in an increase in the average molecular weight co-inciding with a decrease in polymer solubility, to thereby form the protective resist film. A conventional mercury arc lamp generating U.V. light at an appropriate wavelength for the resist being employed can be used as the source of the U.V. illumination. Suitable negative resists for use in this invention generally respond to U.V. radiation of about 330–430 nm.

Figure 3A:
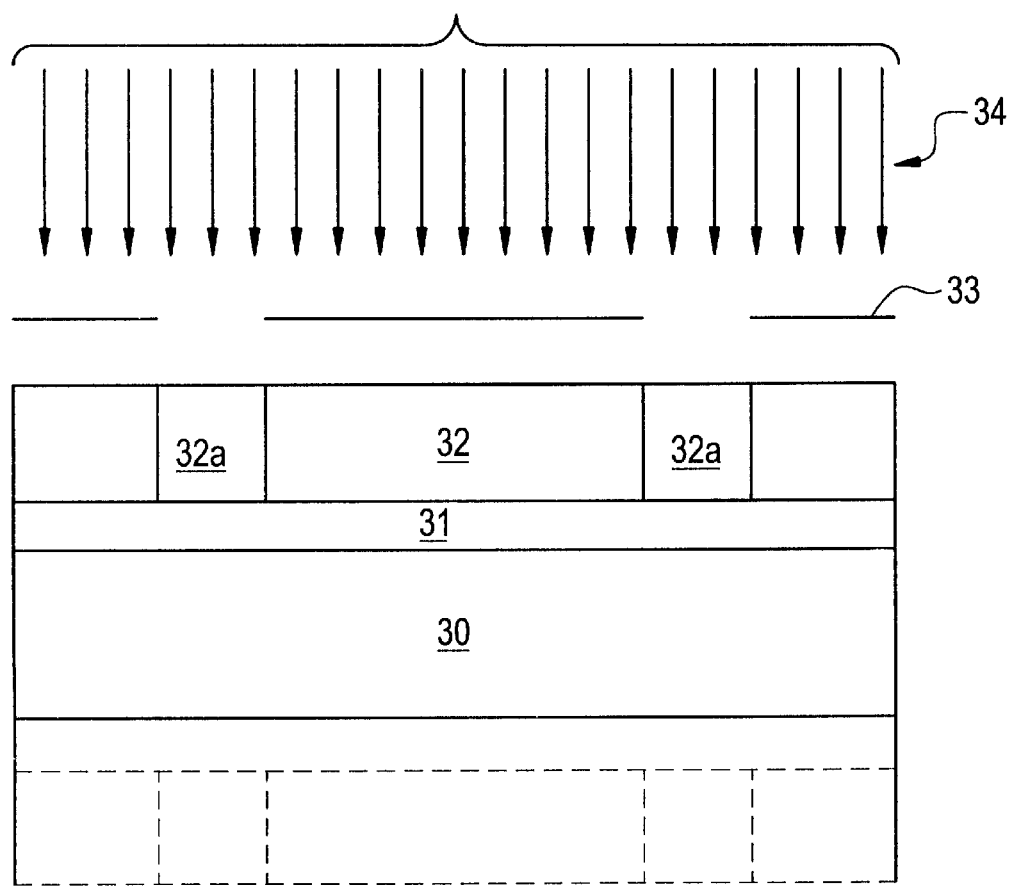
FIGS. 3A and 3B are schematic cross-sectional views of the imaging and consolidated developing/etching steps, in that sequence, of the present invention.

FIG. 3A schematically shows how the imaging step 3 of FIG. 2 is effected on a workpiece. Namely, U.V. radiation 34 is projected through reticle 33 to illuminate exposed regions 32*a* of resist 32. The resist 32 is pre-disposed on the metal film 31 attached to its polymeric substrate 30. The hatched lines indicate the duplicate metal film and resist coating formed on the opposite major face of the substrate 30. Since it will be understood that the process of the present invention can be executed on one or both major faces of the same substrate 30, processing is only shown for one side of the substrate in FIG. 3A for sake of simplifying the illustration.

Then, as indicated by step 4 of FIG. 2, the imaged resist coating is then rebaked (i.e., hard baked) to advance crosslinking and densify the exposed areas of the resist. The post-exposure baking is conducted well below the glass transition temperature of the resist, e.g., at about 85–110° C. for between about 10 to 40 minutes. Suitable heating times will vary with the particular post exposure bake temperature used, with lower bake temperatures generally requiring longer heating periods.

Next, as indicated by step 5 of FIG. 2, under process pathway P1 where the metal is an aluminum or an aluminum alloy susceptible to caustic etch removal, the imaged and hard baked workpiece is subjected to a single, combined development and metal pattern etching operation. An important feature of the present invention is that development and pattern transfer into the metal through the exposed resist areas is accomplished using a single liquid formulation without any interruption or hiatus in time occurring between resist development activity and metal corrosion activity in the exposed metal areas. A single formulation of an appropriate caustic etchant is contacted with the workpiece via liquid spray, bath-dip, roller, or other conventional developer/etchant applicators, to provide a combined resist development and metal patterning operation. An appropriate combined caustic resist developer/metal etchant must be aggressive enough to etch both the unexposed resist areas and underlying metal, but not be so aggressive that it attacks the exposed (crosslinked) areas of the resist. The caustic etchant must display this careful balance of properties to permit combination of the development and metal patterning operations into a single step.

One suitable caustic etchant used for this combined development and metal patterning step 5 of the present invention can be formulated by mixing aqueous potassium hydroxide with aqueous sodium hydroxide, and then diluting with water. One specifically useful formulation in this regard contains about 0.5 to 1.0 wt. % of KOH solution (40–50 wt. % KOH solids) and about 4.0 to 5.0 wt % of NaOH (about 45–55 wt. % NaOH solids), to make a useful caustic etchant. Other developer/etchants also could be used as long as they meet the requirements set out above.

After the developing and metal patterning step 5, the crosslinked resist need not be stripped, and, preferably is not stripped from the delineated metal pattern. The epoxy-based negative resists, in particular, have dielectric properties well-suited for the resistive sheet environment. Moreover, the resist protects the underlying metal pattern from surface oxidation. Thus, the resist preferably is left on the delineated metal pattern as a permanent integral feature of the resistive sheet product. The present invention thereby also avoids the conventional processing step of resist stripping to further simplify the process scheme.

Figure 3B:
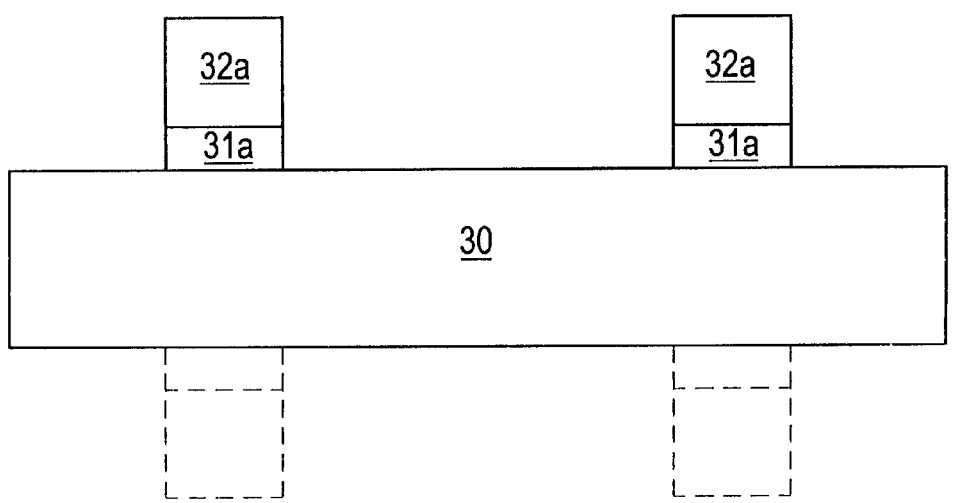

FIG. 3B schematically shows the resulting etched structure 35 of the combined development and metal patterning step 5 of FIG. 2. As seen in FIG. 3B, the exposed crosslinked areas 32*a* of the patterned resist are retained over the underlying metal pattern 31*a* left on the substrate 30.

Optionally, after the combined development and metal patterning step 5, the workpiece can be thermally cured or post cured using RF or microwave energy by methods well known in the coatings industry to further harden, if necessary, any unreacted resist components, and to enhance the flexibility of the resist and improve adhesion of the resist to the substrate.

As a variation on the above process flow, as indicated as pathway P2 in FIG. 2 where a non-aluminum metal is instead provided on the substrate, the resist is developed in step 5A with the developer/etchant solution used in step 5 of pathway P1, but the underlying pattern of metal that is exposed through development of the resist not etched in this step. Then, in step 6A, the exposed pattern of metal is etched away with an acid (i.e., a solution with pH <7). For instance, nickel, nickel-boron, nickel-iron, nickel-iron-cobalt are etchable with an aqueous ferric chloride solution, while aqueous ferric sulfate is preferred for etching nickel-phosphorus with high levels of phosphorus.

While pathway P2 requires separate development and metal patterning steps, it nonetheless also reduces the overall number of processing steps because the resist mask pattern used in step 6A is not stripped off after the metal patterning step. Instead, the resist mask is left on the metal patterned structure as a permanent, high temperature tolerant, dielectric protective layer over the metal pattern.

The conductive images patterned on the substrate by the method of this invention usually will have a pattern tailored to meet the desired electrical or electrical-altering properties of the resistive sheet.

The following non-limiting Examples are illustrative of the invention.

EXAMPLES

Sheets of two-sided aluminized MYLAR® film, obtained from Schaar Industries, Inc., Bloomfield Conn., and having a resistivity of 2 ohm/square, were adhesively taped to fiberglass "picture" frames (12 in.×17" in.×$\frac{1}{16}$ in. thick having a one inch border width).

Each frame was partially dipped in diluted MULTI-POSIT™ 9500 photoresist in manner leaving a four inch wide band of aluminum at the top of the sheet uncoated and unprotected with the resist coating. The dilution of the MULTIPOSIT™ 9500 photoresist was accomplished using methyl ethyl ketone (MEK) to provide 20% solids content. The dipped frames were air dried for 30 minutes and soft baked at 90° C. for 30 minutes. Each side of the resist-coated workpiece was exposed to U.V. light ($\lambda$=365 nm) using a mercury arc lamp source imaged through a reticle defining the desired metal pattern such that the exposed resist areas received a dosage of about 800 mJ/cm$^2$ and crosslinked.

Then, the imaged resist coating was rebaked (i.e., enhanced baked) at 90° C. for 30 minutes, and then processed by being conveyed through a conventional developer module, "Dev Module TSC 3112–30" manufactured by Total Systems Concept, Inc., 3630 Scarlet Oak, St. Louis, Mo. 63122, which involved a motorized conveyor belt used to convey the workpiece through a spray chamber and a water spray rinse chamber, in that sequence. The speed of the conveyor belt was controllable to control the residence time of a workpiece being passed through the spray chamber.

The spray chamber included curtain nozzles arranged on each side of the workpiece to direct caustic etchant in uniform amounts over the entire surface of the workpiece. The nozzles continuously sprayed a weak caustic solution simultaneously against the imaged resist coating presented on each side of the substrate and at a constant volumetric rate. The spray nozzles were fluidly connected to a tank of fresh etchant having temperature control means.

The caustic etchant used for this development step was formulated by mixing 0.75 liters of KOH solution (45 wt. % KOH solids) and 4.5 liters of NaOH (50 wt. % NaOH solids), and adding an amount of deionized water with stirring sufficient to make 100 liters of caustic etchant.

The etch time and temperature were adjusted in ten separate runs, runs 1–10, using a different cleaned and fresh aluminized frame for each run to determine the sensitivity of the pattern transfer process of interest to these variables.

After traversing the etch spray chamber, the etched workpiece was conveyed through a conventional water spray rinse chamber to clear the etchant residues from the surfaces of the workpiece. The workpiece was then air dried and the etch results were evaluated.

The two-sided metallized Mylar® etch results are summarized in Table 1 below, and indicate the caustic specific gravity (measured with a hydrometer), caustic etchant temperature, the residence time of the workpiece in the spray chamber, etch results, and product quality ratings (viz., A=acceptable or UA=unacceptable for resistive sheet purposes).

TABLE 1

| Run | Caustic specific gravity | Caustic Temp. (° C.) | Residence Time (sec.) | 4" Uncoated Band Area unprotected Aluminum | Resist Coated Area uncrosslinked resist region | Product Quality |
|---|---|---|---|---|---|---|
| 1 | 1.035 | 34 | 38 | removed | removed | A |
| 2 | 1.035 | 34 | 60 | removed | removed | A |
| 3 | 1.040 | 38 | 90 | removed | wide line | A |
| 4 | 1.034 | 34 | 120 | removed | overetched | UA |
| 5 | 1.050 | 34 | 90 | removed | overetched | UA |
| 6 | 1.035 | <34 | 90 | remained | partially etched | A |
| 7 | 1.035 | <34 | 120 | removed | partially etched | UA |
| 8 | 1.035 | 23 | 56 | removed | no etch (remained) | UA |
| 9 | 1.035 | 23 | 94 | removed | no etch (remained) | UA |
| 10 | 1.035 | 23 | 38 | remained | no etch (remained) | UA |

As seen by the results summarized in Table 1, in runs 1 and 2, the best results were achieved in that not only the non-crosslinked areas of the resist were removed during the spray treatment, but also the aluminum was removed in the exposed underlying areas only until the substrate was exposed such that resist development and the metal transfer etch were accomplished in a single operation without disturbing the metal areas remaining where protected by crosslinked resist. That is to say, the caustic etchant removed not only the non-crosslinked (non-imaged) resist areas but also the aluminum metal areas located directly underneath all in one etching step. The UV-exposed (crosslinked) resist area were left on the unetched metal areas.

In runs 4 and 5, by contrast, the residence time was found to be too protracted such that metal was removed not only under non-crosslinked resist areas but also the other metal areas disposed under crosslinked resist. As a consequence, the resist and metal were undesirably indiscriminately stripped down to the substrate in runs 4 and 5. By contrast, in run 3, the metal remained under the imaged resist, although wide lines indicated some undercutting was taking place. As to run 6, the residence time was too short and the etchant temperature was too low to enable all the exposed aluminum areas to be etched away with the overlying non-crosslinked resist areas. As can be appreciated from the results reported in Table 1, the choice of etchant, its temperature during etching, as well the etch residence time, all have to be properly controlled to achieve the desired outcome of this invention, and this control can be effected through empirical experimentation for the given etchant, resist and metallized substrate, once the basic concepts of this invention are implemented.

Runs 7–9 showed that the unprotected aluminum was removed, but the uncrosslinked resist was not. Neither the unprotected aluminum nor the uncrosslinked resist were removed using the conditions of run 10. This result indicated that the underlying aluminum will always be etched away provided the uncrosslinked resist is removed by the etchant. The results, taken as a whole, indicated that is was easier for the etchant to remove unprotected aluminum than the uncrosslinked resist.

The results summarized in Table 1 demonstrate that the methodology of the present invention provides a route for successfully completing pattern transfer processing in resistive sheets in a reduced number of process steps.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A resistive sheet making process for forming an electrical-field altering image on a metallized substrate, comprising the steps of:
    providing a workpiece comprising a polymeric substrate bearing a metal film comprising aluminum on at least one major surface of the polymeric substrate;
    applying a negative working resist coating layer on said metal film;
    forming a photoimaged resist coating by photoimaging an exposed resist pattern in the resist coating layer while leaving a non-exposed resist pattern in the resist coating layer;
    contacting said photoimaged resist coating with a caustic solution that removes said non-exposed resist pattern and aluminum material of said metal film where located directly underneath said non-exposed resist pattern while leaving aluminum material from said metal film as a non-exposed metal film pattern where located underneath the exposed resist pattern, thereby providing said electrical-field altering image; and
    curing the exposed resist pattern to form a permanent dielectric coating therefrom on the non-exposed metal film pattern, and thereby forming said resistive sheet.

2. The process of claim 1, wherein said polymeric substrate is selected from the group consisting of polyethylene terephthalate and polyimide, and said metal film is selected from the group consisting of aluminum and aluminum alloys.

3. The process of claim 1, wherein said metal film forms a continuous film on said major surface of said polymeric substrate sheet.

4. The process of claim 3, wherein said negative working resist coating layer comprises a photoimageable composition containing a radiation sensitive component, a resin binder, a polybutadiene having one or more internal epoxide groups, and optionally further includes a crosslinking agent.

5. The process of claim 1, wherein said metal film is formed on both major surfaces of said polymeric substrate.

6. The process of claim 1, wherein said negative working resist coating layer comprises a U.V.-curable resin.

7. The process of claim 1, wherein said photoimaging step comprises projecting radiation through a reticle mask onto said resist coating layer to form said exposed resist pattern and adjoining non-exposed resist pattern in the resist coating layer.

8. The process of claim 1, wherein said caustic solution comprises an aqueous solution containing potassium hydroxide and sodium hydroxide.

9. The process of claim 1, wherein said curing comprises subjecting said exposed resist pattern to processing including a step selected from the group consisting of thermal curing, RF energy exposed and microwave energy exposure.

10. The process of claim 1, wherein said metal film is formed on both major surface of said polymeric substrate, and said applying, photoimaging and contacting steps are performed on the metal film on both major surface of said polymeric substrate.

11. The process of claim 1, wherein said caustic solution comprises 0.25 to 0.5 wt. % of KOH and 2.0 to 2.5 wt. % NaOH and the balance substantially comprised of water.

12. The process of claim 1, wherein said aluminum film pattern is formed on both major faces of said substrate, and said applying, photoimaging, and contacting steps are performed on the metal film on both major surfaces of said substrate.

13. The process according to claim 1, wherein said curing comprises subjecting said exposed resist pattern to processing including a step selected from the group consisting of thermal curing, RF energy exposure and microwave energy exposure.

14. A resistive sheet making process for forming an electrical-field altering image on a metallized substrate, comprising the steps of:
    providing a workpiece comprising a polymeric substrate bearing a metal film comprising nickel on at least one major surface of the polymeric substrate;
    applying a negative working resist coating layer on said metal film;
    forming a photoimaged resist coating by photoimaging an exposed resist pattern in the resist coating layer while leaving a non-exposed resist pattern in the resist coating layer;
    contacting said photoimaged resist coating with a caustic solution that removes said non-exposed resist pattern and thereby providing a pattern of exposed metal material by exposing underlying metal of said metal film;
    contacting said pattern of exposed metal material with an acidic etchant selected from the group consisting of aqueous ferric chloride and aqueous ferric sulfate effective to remove the pattern of exposed metal material while leaving a non-exposed metal pattern located underneath the exposed resist pattern, thereby providing said electrical-field altering image;
    curing said exposed resist pattern sufficient to permanently attach said exposed resist pattern to said non-exposed metal pattern, and thereby forming said resistive sheet.

15. The process of claim 14, wherein said metal comprises a nickel alloy.

16. A process for providing an electrical-field altering image on a metallized substrate for use as a resistive sheet, comprising the steps of:
    providing a workpiece comprising a polymeric substrate bearing a metal film comprising aluminum on at least one major surface of the polymeric substrate;
    applying a negative working resist coating layer on said metal film;
    forming a photoimaged resist coating by photoimaging an exposed resist pattern in the resist coating layer while leaving a non-exposed resist pattern in the resist coating layer;

contacting said photoimaged resist coating with a caustic solution that removes said non-exposed resist pattern and aluminum material of said metal film where located directly underneath said non-exposed resist pattern while leaving aluminum material from said metal film as a non-exposed metal film pattern where located underneath the exposed resist pattern;

curing the exposed resist pattern to form a permanent dielectric coating therefrom on the non-exposed metal film pattern, and thereby forming a resistive sheet having an electrical-field altering image; and altering an electrical field using said resistive sheet.

* * * * *